(12) United States Patent
Fahrenkrug et al.

(10) Patent No.: US 8,766,810 B2
(45) Date of Patent: Jul. 1, 2014

(54) INDIRECT MEASUREMENT METHOD AND SYSTEM FOR MONITORING AND REPORTING LEAKAGE CURRENTS

(75) Inventors: Craig C Fahrenkrug, Vestal, NY (US); Robert C Dively, Williamsburg, VA (US)

(73) Assignee: International Intelligent Metering, LLC, Williamsburg, VA (US)

( * ) Notice: Subject to any disclaimer, the term of this patent is extended or adjusted under 35 U.S.C. 154(b) by 86 days.

(21) Appl. No.: 13/543,839

(22) Filed: Jul. 8, 2012

(65) Prior Publication Data
US 2014/0009299 A1    Jan. 9, 2014

(51) Int. Cl.
*G08B 21/00*    (2006.01)

(52) U.S. Cl.
USPC .................... 340/664; 340/636.11; 340/693.1

(58) Field of Classification Search
USPC ......... 340/664, 659–660, 661–663, 657, 635, 340/636.11–636.13, 636.17, 693.1, 693.4, 340/3.43, 3.62
See application file for complete search history.

(56) References Cited

U.S. PATENT DOCUMENTS

| 4,710,919 | A | * | 12/1987 | Oliver et al. | 370/242 |
| 5,847,946 | A | * | 12/1998 | Wong | 363/60 |
| 5,990,685 | A | * | 11/1999 | Nightall | 324/509 |
| 5,995,387 | A | * | 11/1999 | Takahashi et al. | 363/21.04 |
| 8,189,307 | B2 | * | 5/2012 | Lee et al. | 361/42 |
| 2007/0168141 | A1 | * | 7/2007 | Wang et al. | 702/60 |
| 2008/0112100 | A1 | * | 5/2008 | Liu | 361/45 |
| 2010/0097733 | A1 | * | 4/2010 | E. | 361/42 |

* cited by examiner

*Primary Examiner* — Daniel Previl
(74) *Attorney, Agent, or Firm* — Peter J. Van Bergen

(57) ABSTRACT

A system and method are provided for monitoring and reporting leakage currents caused by a load that is coupled to an AC supply line. A sensor positioned adjacent to an AC supply line senses an amperage difference between currents traveling along the AC supply line. A processor coupled to the sensor compares the amperage difference to a threshold value. A reporting device coupled to the processor generates a report at least when the amperage difference exceeds the threshold value.

13 Claims, 5 Drawing Sheets

INDIRECT MEASUREMENT METHOD AND SYSTEM FOR MONITORING AND REPORTING LEAKAGE CURRENTS

FIELD OF THE INVENTION

The invention relates generally to leakage current detection, and more particularly to a system and method for monitoring and reporting leakage currents using an indirect measurement scheme.

BACKGROUND OF THE INVENTION

As the number of electrically-powered vehicles increases so does the need for "plug in" charging stations. Such vehicles include land-based vehicles (e.g., automobiles, recreational vehicles, etc.) and watercraft. In the case of recreational vehicles and watercraft, users typically need to "plug in" to re-charge their batteries and tend to stay "plugged in" since they also stay in/on the vehicle/watercraft and use the power to operate on-board conventional systems (e.g., lights, appliances, heating and/or air conditioning systems, etc.). Regardless of the user or their vehicle type, the supplier of power to such charging and/or power supply stations wants to charge the user for the power consumed. This means that charging/power stations typically include some type of metering device for measuring the amount of power consumed.

A potential danger associated with charging/power stations arises from leakage currents that can develop from systems on the vehicle that are plugged into a station. Briefly, leakage currents are derived from normal and abnormal connections of the source and safety earth in the charging and metering systems. Electric motor frequency drives and other variable frequency systems generate high dv/dt transients that, in turn, cause leakage currents due to stray capacitances. Leakage currents often flow back to the source through the associated ground conductor. However they can also flow through alternate unintended ground paths that may pose hazards.

In a boating/marina environment, the dangers associated with even small leakage currents is substantial. More specifically, the leakage currents are drawn into the water via various boat hull fittings or other exposed metal in the water (e.g., anchors, propellers, etc.). The water acts as a current sink (i.e., an alternative conducting path) for the leakage currents as they try to find a path back to their source. The leakage currents subject these current sinks to corrosion and pose as a serious shock threat to a swimmer as a mere 50 milliamps of AC current can be lethal.

Current charging and metering systems utilize various "limit-detection and interrupt" devices/systems (e.g., ground fault interrupts or GFIs, residual current devices or RCDs, fuses, etc.). These devices/systems trigger an exception event and eliminate the power available from the source. Many loads cannot be operated with these types of systems because the loads have high leakage currents and, therefore, will generate nuisance trips of a limit-detection and interrupt device. Additionally, faults causing trips of limit-detection and interrupt devices do not allow the operator to "debug" the system because the operations are suspended immediately upon the exceeding of a set limit. This limit is not adjustable by the user or service provider. Finally, mechanical systems that cause faults to be generated do not report data to the service provider, and do not provide detailed information about the duration, measured levels, or other data that is useful in determining and correcting a faulty load.

SUMMARY OF THE INVENTION

Accordingly, it is an object of the present invention to provide a system and method for monitoring and reporting leakage currents caused by a load that is coupled to an AC supply line.

Another object of the present invention is to provide a system and method for monitoring and reporting leakage currents that indicates the severity thereof.

Still another object of the present invention is to provide a system and method for the simultaneous metering of power usage, monitoring of leakage currents, and reporting of the leakage currents, associated with a load that is coupled to an AC supply line.

Other objects and advantages of the present invention will become more obvious hereinafter in the specification and drawings.

In accordance with the present invention, a system and method are provided for monitoring and reporting leakage currents caused by a load that is coupled to an AC supply line. At least one sensor is positioned adjacent to an AC supply line for sensing an amperage difference between currents traveling along the AC supply line. A processor coupled to the sensor compares the amperage difference to a threshold value. At least one reporting device coupled to the processor generates a report at least when the amperage difference exceeds the threshold value.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

Figure 1:
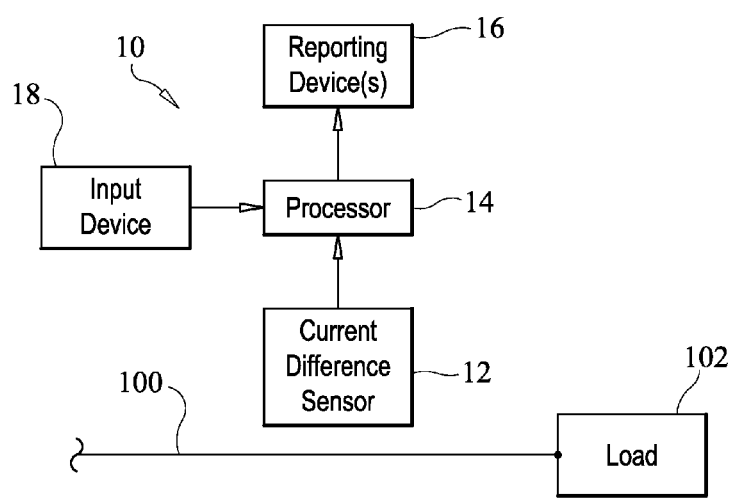
FIG. 1 is a block diagram of a system for monitoring and reporting leakage currents caused by a load coupled to an AC supply line in accordance with an embodiment of the present invention.

Referring now to the drawings and more particularly to FIG. 1, a system for monitoring and reporting leakage currents caused by a load 102 coupled to an alternating current (AC) supply line 100 is referenced generally by numeral 10. As will be described later herein, monitoring/reporting system 10 can be added to or integrated with power charging/supply and metering stations/pedestals. However, the present invention is not so limited as monitoring/reporting system 10 can be used to monitor/report leakage currents caused by any load coupled to an AC supply line.

Monitoring/reporting system 10 includes at least one current difference sensor 12 positioned adjacent to AC supply line 100, a processor 14, and at least one reporting device 16. Current difference sensor 12 can be sensitive to AC currents, DC currents, or AC and DC currents without departing from the scope of the present invention. In terms of AC current sensing, sensor 12 can be a current transformer (CT) coil, a Rogowski coil, or a Hall effect sensor. For DC currents, sensor 12 can be sense resistor or a Hall effect sensor. While most leakage currents have AC and DC components, AC leakage currents are most significant for a number of applications. For example, AC leakage currents represent a substantial source of equipment damage and personnel safety concerns for dockside-mounted power charging/supply pedestals. Accordingly, current different sensing of AC leakage currents will be explained for several different AC supply line configurations illustrated in FIGS. 2-5 and 7.

Figure 2:
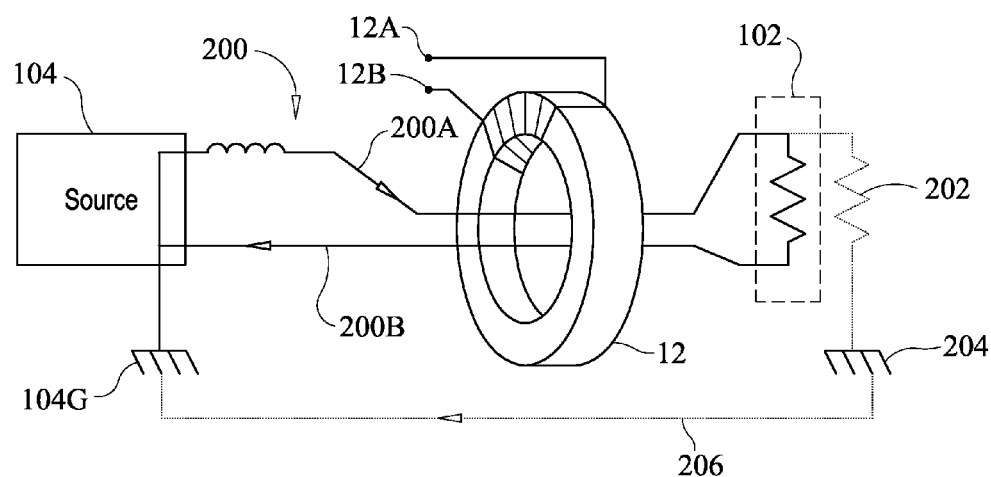
FIG. 2 is a schematic view of an exemplary current difference sensor arrangement for a single-phase two-wire supply line.
Figure 3:
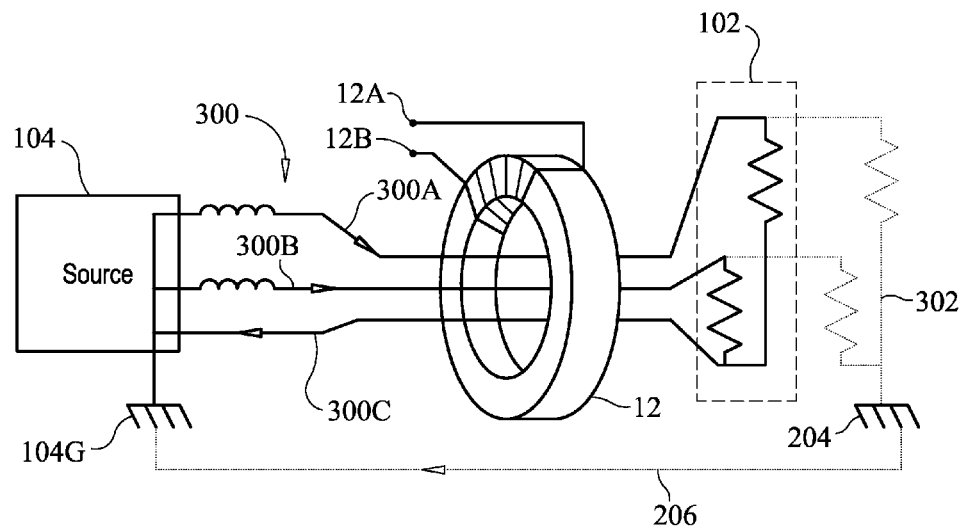
FIG. 3 is a schematic view of an exemplary current difference sensor arrangement for a single-phase three-wire supply line.

Referring first to FIG. 2, a single-phase two-wire AC supply line 200 has two conductors 200A and 200B. Conductor 200A carries current travelling from a source 104 toward a load 102 and (neutral) conductor 200B carries the return current from load 102 to source 104. In the absence of any leakage currents, the currents travelling in conductors 200A and 200B cancel each other out such that a current difference sensor 12 (e.g., a CT or Rogowski coil) disposed about conductors 200A and 200B would sense a difference of zero amps. However, if load 102 includes one or more "leaky" devices/systems, a leakage current $I_{202}$ (leaking along conductive paths indicated by dotted line circuit path representation 202) will seek an earth ground 204. Leakage current $I_{202}$ returns to the source earth ground 104G as a ground current designated by dotted line 206. The current relationships used to indirectly measure leakage current $I_{202}$ are set forth below where "I" refers to current, "output" refers to the current output of sensor 12 at terminals 12A/12B thereof, and "A" refers to the known gain of sensor 12 (e.g., the turns ratio for a CT or a Rogowski coil, known parameter of a Hall effect sensor, the resistance value of a sense resistor, etc.). In accordance with Kirchhoff's current law, $$I_{200A} = I_{200B} + I_{202}$$

The output of sensor 12 is written as $$OUTPUT = (I_{200A} - I_{200B})*A$$

Combining these two relationships yields $$OUTPUT = I_{202}*A$$

That is, the subtraction of currents in the above-relationship is performed by sensor 12 such that leakage current $I_{202}$ is measured indirectly by sensor 12.

A similar analysis can be applied to the single-phase three-wire AC supply line 300 having three conductors 300A-300C. In this configuration, conductors 300A and 300B carry current from source 104 toward load 102 and (neutral) conductor 300C carries the return current from load 102 to source 104. Assuming the presence of leakage path 302 and leakage current $I_{302}$, the analogues current relationships are $$I_{300A} + I_{300B} = I_{300C} + I_{302}$$

and the OUTPUT of sensor 12 disposed about conductor 300 is written as $$OUTPUT = (I_{300A} + I_{300B} - I_{300C})*A$$

Combining these two relationships yields $$OUTPUTS = I_{302}*A$$

That is, leakage current $I_{302}$ is again measured indirectly by sensor 12.

Figure 4:
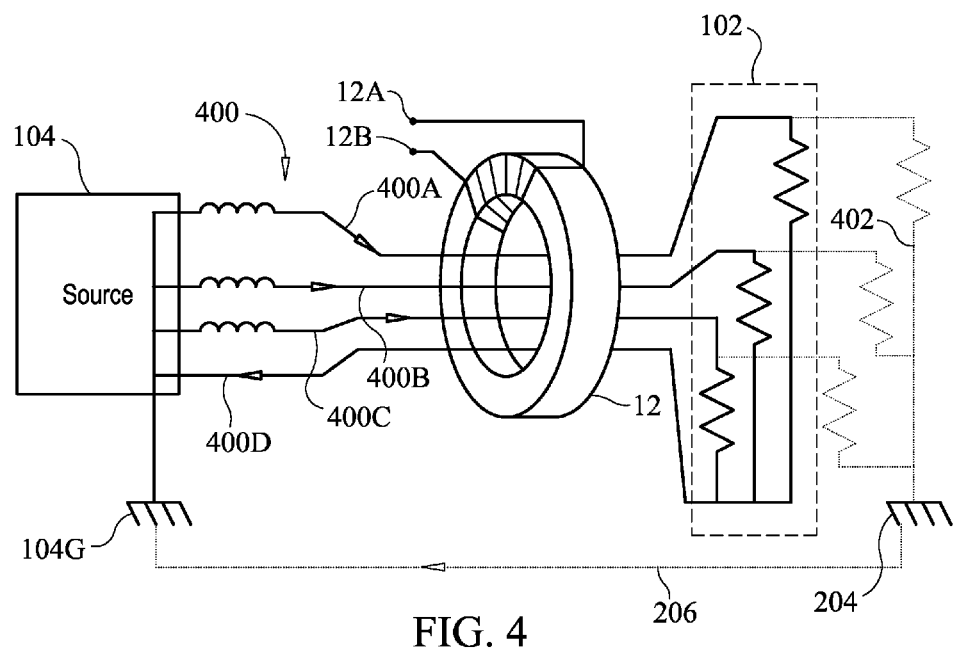
FIG. 4 is a schematic view of an exemplary current difference sensor arrangement for a three-phase four-wire AC supply line.

In FIG. 4, sensor 12 is disposed about a four-wire conductor 400 of a three-phase AC supply line configuration (i.e., a "wye" configuration). Conductors 400A-400C carry current from source 104 toward load 102 and (neutral) conductor 400D carries the return current from load 102 to source 104. Assuming the presence of leakage paths 402 and leakage current $I_{402}$, the current relationships are $$I_{400A} + I_{400B} + I_{400C} = I_{400D} + I_{402}$$

and the OUTPUT of sensor 12 disposed about conductor 400 is written as $$OUTPUT = (I_{400A} + I_{400B} + I_{400C} - I_{400D})*A$$

Combining these two relationships yields $$OUTPUT = I_{402}*A$$

Thus, leakage current $I_{402}$ is measured indirectly by sensor 12.

Figure 5:
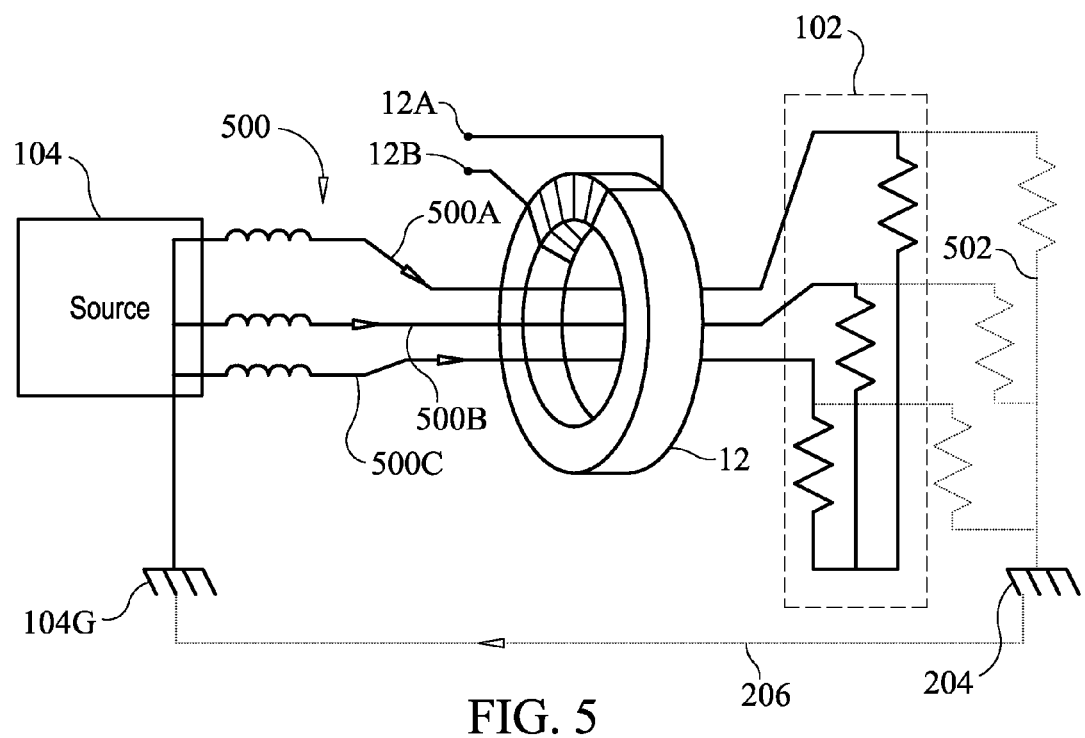
FIG. 5 is a schematic view of an exemplary current difference sensor arrangement for a three-phase three-wire AC supply line.

FIG. 5 illustrates a three-phase three-wire AC supply line 500 (i.e., a "delta" configuration) with sensor 12 disposed about the three conductors 500A-500C. In this embodiment, sensor 12 detects any variation between current traveling in conductors 500A-500C where such variation is caused by leakage currents. Assuming the presence of leakage path 502 and leakage current $I_{502}$, the current relationships are $$I_{500A} + I_{500B} + I_{500C} = I_{502}$$

and the OUTPUT of sensor 12 disposed about conductor 500 is written as $$OUTPUT = (I_{500A} + I_{500B} + I_{500C})*A$$

Combining these two relationships yields $$OUTPUT = I_{502}*A$$

so that leakage current $I_{502}$ is measured indirectly by sensor 12.

Referring again to FIG. 1, the current difference output of sensor 12 (regardless of the configuration of AC supply line 100) is provided to processor 14. In terms of current leakage monitoring, processor 14 compares the current difference output of sensor 12 to a threshold value. The threshold value can be pre-determined for a particular application and pre-programmed into processor 14. The threshold value could also be made adjustable by providing an input device 18 (e.g., keypad or keyboard, wireless receiver, etc.) that can receive user-supplied threshold value updates/changes that are provided to processor 14 for use in its comparison to the output of sensor 12. The comparing process performed by processor 14 can occur continuously, periodically, randomly, etc., without departing from the scope of the present invention.

The results of the comparison(s) are provided to one or more reporting device 16. The types and locations of reporting device 16 can be multiple and/or varied depending on the application. Some embodiments of reporting device 16 include visual reporting devices (e.g., LEDs, display, etc.) positioned at or near the location of sensor 12, devices that produce audible representations of the comparison(s), and devices that produce digital representations of the comparison(s) where such digital representations can be stored for later retrieval, transmitted (via hardwire or wireless connection) to a remote location, etc. The generation of a visual, audible and/or digital report (of the comparisons) can occur continually or only when a current difference output of sensor 12 exceeds the threshold value. Examples of reporting device 16 could include a series of different color LEDs (e.g., a "traffic light" configuration of green, yellow and red LEDs) that present a different color depending on the result of a comparison where green could indicate none-to-minimal leakage currents, yellow could indicate that leakage currents may be a growing concern, and red could indicate there is a serious leakage current). Reporting device 16 could additionally or alternatively include a display presenting a numeric value of the current difference and/or a graphic depiction thereof (e.g., analog curve, bar graph, etc.) with respect to time. In terms of an audible presentation of the report, device 16 could be an audible alarm sounded when the threshold value was exceeded during the comparison. The audible report could be provided in addition to or as an alternative to other reporting devices. Still further, reporting device 16 could include local memory storage of the reports and/or a transmission device for forwarding the reports to a remote/central location where the reports could be stored and/or used to produce visual and/or audible representations thereof.

As mentioned above, the present invention can be incorporated into a power charging/supply station that included the means to meter the amount of power used by a load (or loads) coupled thereto. An example of this type of application is a marina/dockside environment where power charging/supply pedestals are provided for boat owners. Further, since the inherent risks associated with leakage currents in a marina environment are substantial, an embodiment of the present invention for use in a marina/dockside environment will now be explained with reference to FIG. 6. Note that this embodiment could also be used by land-based recreational vehicles.

Figure 6:
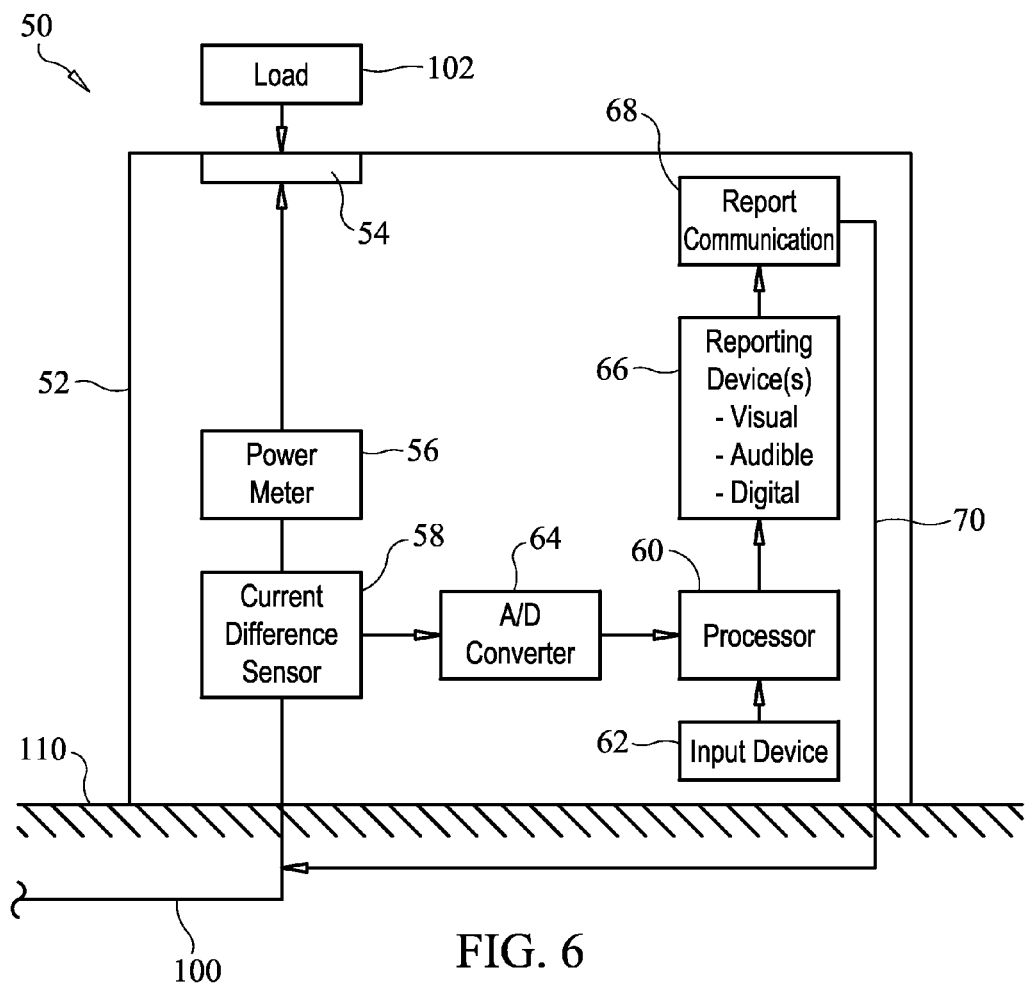
FIG. 6 is a block diagram of a system in accordance with an embodiment of the present invention that provides for the simultaneous metering of power usage, monitoring of leakage currents, and reporting of the leakage currents, associated with a load that is coupled to an AC supply line.

FIG. 6 depicts a self-contained system 50 for the automated and simultaneous metering of power usage, monitoring of leakage currents, and reporting of the leakage currents associated with an electrical load 102 that is to be powered by an AC supply line 100. System 50 is mounted/contained in a pedestal housing 52 configured for mounting to a surface 110 (e.g., a dock or pier) in any suitable fashion. It is to be understood that the design of pedestal 52 and the mounting thereof to surface 110 are not limitations of the present invention. AC supply line 100 is led into pedestal 52 and ultimately to a power receptacle 54 where at least a portion of the current provided by AC supply line 100 is made available to load 102 coupled to receptacle 54. Several such receptacles 54 can be provided without departing from the scope of the present invention. In addition, other components typically found in such power charging/supply stations (e.g., bus bars, transformers, etc.) can be provided as needed, but such inclusion or exclusion is not a limitation of the present invention.

Coupled to AC supply line 100 in pedestal 52 is a power meter 56 that can be any conventional power measuring device that meters/records power usage by load 102. The particular design of power meter 56 is not a limitation of the present invention.

A current difference sensor 58 (or sensors) analogous to the above-described sensor 12 is provided in pedestal 52 and is positioned adjacent to AC supply line 100 (e.g., disposed about AC supply line 100 in the case of an AC measuring coil-based sensor). Sensor 58 can be placed before or after power meter 56 without departing from the scope of the present invention. With at least one load 102 coupled to at least one receptacle 54, sensor 58 performs its indirect monitoring of leakage currents as described earlier herein. The output of sensor 58 is provided to a processor 60 that performs a comparison with a threshold value that is either pre-programmed or adjustable via input device 62. The sensor output can be digitized by an analog-to-digital converter 64 prior to being provided to processor 60. Converter 64 could also be integrated directly into processor 60 without departing from the scope of the present invention.

Processor 60 provides the results of its comparisons to reporting device(s) 66 that can include any or all of the visual, audible, and/or digital reporting devices described earlier herein. Transmission of the reports to a remote location could be accomplished via a report communication system 68, e.g., one or more of wireless or hardwired transmission systems. In terms of a hardwire configuration, the present invention could utilize a dedicated line (not shown) or power line communication indicated by line 70. As is known in the art, power line communication 70 provides for transmission of digital data using AC supply line 100.

The advantages of the present invention are numerous. An indirect measurement of leakage currents is performed directly on an AC supply line to which potentially leaky loads are coupled. Monitoring and reporting of leakage currents is carried on without interrupting electrical service. In this way, nuisance trips generally associated with conventional "limit-detection and interrupt" devices are avoided. At the same time, leakage currents can be monitored/reported on a time lapse basis to provide an indication of increasing threat levels. The present invention can be incorporated with a power charging/supply station to provide a self-contained and automated system that meters power usage, monitors leakage currents, and reports leakage currents when an electrical load is powered by an AC supply line.

Figure 7:
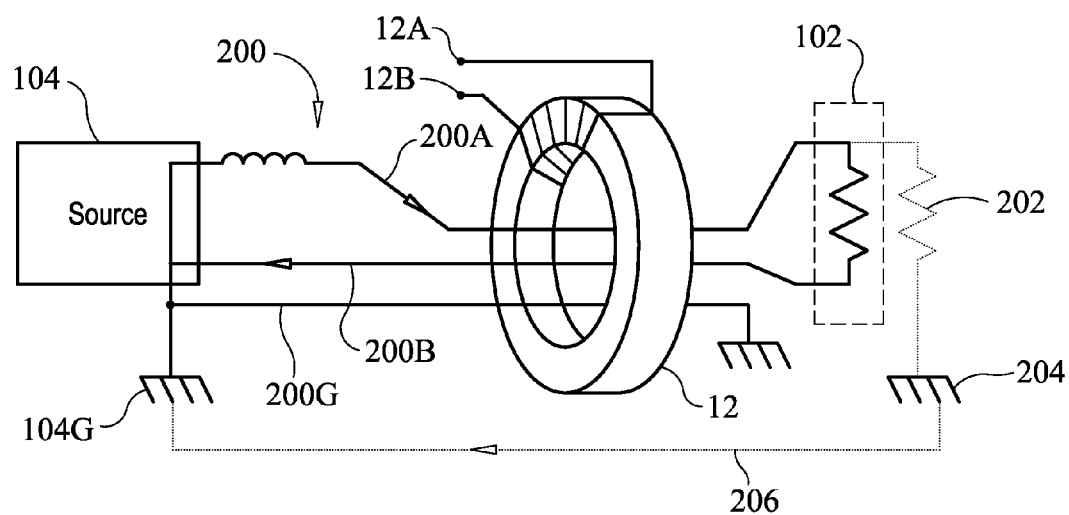
FIG. 7 is a schematic view of another exemplary current difference sensor arrangement for a single-phase two-wire supply line with an earth ground connection.

Although the invention has been described relative to a specific embodiment thereof, there are numerous variations and modifications that will be readily apparent to those skilled in the art in light of the above teachings. For example, the present invention can also be used in wiring situations that routed a supply line's earth ground through the sensor. This is illustrated in FIG. 7 for the previously-described single-phase two-wire supply line 200 where the line's earth ground 200G (i.e., incorporated in the line's cable where it is not generally accessible) passes through sensor 12. It is therefore to be understood that, within the scope of the appended claims, the invention may be practiced other than as specifically described.

What is claimed as new and desired to be secured by Letters Patent of the United States is:

1. A system for the simultaneous metering of power usage, monitoring of leakage currents, and reporting of the leakage currents associated with a load, comprising:
   an AC supply line coupled to a load;
   a power meter coupled to said AC supply line for measuring power used by the load;
   at least one sensor positioned adjacent to said AC supply line for sensing an amperage difference between currents traveling along said AC supply line to the load, said at least one sensor including a coil-based sensor disposed around said AC supply line;
   a processor coupled to said at least one sensor for comparing said amperage difference to a threshold value; and
   at least one reporting device coupled to said processor for generating a report at least when said amperage difference exceeds said threshold value.

2. A system as in claim 1, wherein said at least one sensor is sensitive to AC currents.

3. A system as in claim 1, wherein said at least one sensor is sensitive to AC currents and DC currents.

4. A system as in claim 1, wherein said at least one sensor is selected from the group consisting of a current transformer coil, a Rogowski coil, a resistor, and a Hall effect sensor.

5. A system as in claim 1, further comprising an input device coupled to said processor for adjusting said threshold value.

6. A system as in claim 1, wherein said at least one reporting device is selected from the group consisting of devices producing a visual representation of said report, devices producing an audible representation of said report, and devices producing a digital representation of said report.

7. A self-contained system for the automated and simultaneous metering of power usage, monitoring of leakage currents drawn into a local environment having exposed current sinks disposed therein, and reporting of the leakage currents, comprising:

an AC supply line;
a pedestal for receiving a portion of said AC supply line therein;
at least one electrical receptacle mounted in said pedestal, each said electrical receptacle coupled to said AC supply line;
a load located on a vehicle supported by a local environment having exposed current sinks disposed therein, said load coupled to said electrical receptacle, wherein at least a portion of electric current available on said AC supply line is provided to to said load coupled to said electrical receptacle;
a power meter coupled to said portion of said AC supply line for measuring power used by said load so coupled to said electrical receptacle;
at least one sensor positioned adjacent to said portion of said AC supply line for sensing an amperage difference between electric currents traveling along said AC supply line to said load so-coupled to said electrical receptacle, said at least one sensor including a coil-based sensor disposed around said portion of said AC supply line;
a processor mounted in said pedestal and coupled to said at least one sensor for comparing said amperage difference to a threshold value; and
at least one reporting device mounted in said pedestal and coupled to said processor for generating a report at least when said amperage difference exceeds said threshold value, wherein said report indicates that leakage currents due to said load are being drawn into the local environment.

8. A self-contained system as in claim 7, wherein said at least one sensor is sensitive to AC currents.

9. A self-contained system as in claim 7, wherein said at least one sensor is sensitive to AC currents and DC currents.

10. A self-contained system as in claim 7, wherein said at least one sensor is selected from the group consisting of a current transformer coil, a Rogowski coil, a resistor, and a Hall effect sensor.

11. A self-contained system as in claim 7, further comprising an input device coupled to said processor for adjusting said threshold value.

12. A self-contained system as in claim 7, wherein said at least one reporting device is selected from the group consisting of devices producing a visual representation of said report, devices producing an audible representation of said report, and devices producing a digital representation of said report.

13. A self-contained system as in claim 7, wherein said at least one reporting device is selected from the group consisting of at least one light emitting diode, a display for displaying a human-readable version of said report, a sound generator for producing an audible version of said report, and a wireless communication device for wirelessly transmitting said report.

* * * * *